United States Patent
Dapkus

(10) Patent No.: US 6,621,842 B1
(45) Date of Patent: Sep. 16, 2003

(54) METHOD AND APPARATUS FOR LONG WAVELENGTH SEMICONDUCTOR LASERS

(75) Inventor: Paul Daniel Dapkus, Fullerton, CA (US)

(73) Assignee: E20 Communications, Inc., Calabasas, CA (US)

( * ) Notice: Subject to any disclaimer, the term of this patent is extended or adjusted under 35 U.S.C. 154(b) by 0 days.

(21) Appl. No.: 09/419,318

(22) Filed: Oct. 15, 1999

(51) Int. Cl.⁷ .................................................. H01S 5/00
(52) U.S. Cl. .............................. 372/45; 372/81; 372/43
(58) Field of Search ..................................... 372/43–50

(56) References Cited

U.S. PATENT DOCUMENTS

| | | | |
|---|---|---|---|
| 5,638,392 A | 6/1997 | Ramdani et al. | 372/45 |
| 5,706,306 A | 1/1998 | Jiang et al. | 372/96 |
| 5,719,893 A | 2/1998 | Jiang et al. | 372/45 |
| 5,726,462 A * | 3/1998 | Spahn et al. | 257/76 |
| 5,732,103 A | 3/1998 | Ramdani et al. | 372/96 |
| 5,793,787 A * | 8/1998 | Meyer et al. | 372/45 |
| 5,796,769 A | 8/1998 | Ramdani et al. | 372/45 |
| 5,815,524 A | 9/1998 | Ramdani et al. | 372/96 |
| 5,831,960 A | 11/1998 | Jiang et al. | 369/121 |
| 5,832,017 A | 11/1998 | Ramdani et al. | 372/45 |
| 5,838,707 A | 11/1998 | Ramdani et al. | 372/45 |
| 5,848,086 A | 12/1998 | Lebby et al. | 372/46 |
| 5,883,912 A | 3/1999 | Ramdani et al. | 372/45 |
| 5,898,722 A | 4/1999 | Ramdani et al. | 372/96 |
| 5,914,973 A | 6/1999 | Jiang et al. | 372/36 |
| 5,917,848 A | 6/1999 | Claisse et al. | 372/96 |
| 5,943,359 A | 8/1999 | Ramdani et al. | 372/96 |
| 5,956,363 A | 9/1999 | Lebby et al. | 372/46 |
| 5,956,364 A | 9/1999 | Jiang et al. | 372/96 |
| 5,963,576 A | 10/1999 | Claisse et al. | 372/96 |
| 5,966,399 A | 10/1999 | Jiang et al. | 372/96 |
| 5,995,529 A * | 11/1999 | Kurtz et al. | 372/45 |
| 6,040,590 A * | 3/2000 | O'Brien et al. | 257/94 |
| 6,088,376 A * | 7/2000 | O'Brien et al. | 372/50 |
| 6,393,038 B1 * | 5/2002 | Raymond et al. | 372/22 |

OTHER PUBLICATIONS

Chow, D.H. (1995) Mid–wave infrared diode lasers based on GaInSb/InAs and InAs/Aisb superlattices. *Applied Physics Letters*, v.67 (25), 3700–02.

Peter, M. (1999) Light–emitting diodes and laser diodes based on a $Ga_{1-x}In_xAs/GaAs_{1-y}Sb_y$ type II superlattice on InP substrate. *Applied Physics Letters*, v.74 (14), 1951–53.

Olesberg, J.T. (1999) Optimization of active regions in midinfrared lasers. *Applied Physics Letters*, v.74 (2), 188–190.

Meyer, J.R. (1998) Auger coefficients in type–II InAs/$Ga_{1-x}In_xSb$ quantum wells. *Applied Physics Letters*, v. 73 (20), 2857–59.

(List continued on next page.)

Primary Examiner—Paul Ip
Assistant Examiner—Davienne Monbleau
(74) Attorney, Agent, or Firm—Blakley Sokoloff Taylor & Zafman

(57) ABSTRACT

A W quantum well structure for active region of semiconductor lasers for long wavelength emission of photons. The energy band lineups in the disclosed heterostructures achieve emission at wavelengths of 1.3 μm or greater. The W quantum well structure and exemplary materials can be applied to any semiconductor laser including a vertical cavity surface emitting laser (VCSEL). The active region is comprised of one or more sets of triad layers of $GaAs_{1-x}N_x$/$GaAs_{1-y}Sb_y$/$GaAs_{1-x}N_x$ to provide the W quantum well structure. The energy band of these materials provides a staggered band alignment which causes electrons and holes to be confined in adjacent layers to one another. Because the wavefunctions associated with these materials tunnel into adjacent layers, optical emission at a longer wavelength is achievable than otherwise available from the energy gaps of the constituent materials alone.

79 Claims, 5 Drawing Sheets

OTHER PUBLICATIONS

Bewley, W.W. (1998) Above–room–temperature optically pumped midinfrared W lasers. *Applied Physics Letters,* v.73 (26), 3833–35.

Flatte, M. (1999) Carrier recombination rates in narrow–gap InAs/Ga$_{1-x}$In$_x$Sb–based superlattices. *Physical Review B,* v.59 (8), 5745–50.

Bhargava, S. (1999) Staggered to straddling band lineups in InAs/Al(As, Sb). *Applied Physics Letters,* v. 74 (8), 1135–37.

Olafsen, L.J. (1998) Near–room–temperature mid–infrared interband cascade laser. *Applied Physics Letters,* v.72 (19), 2370–72.

Lin, C. (1997) Low–threshold quasi–cw type–II quantum well lasers at wavelengths beyond 4μm. *Applied Physics Letters,* v.71 (22), 3281–83.

Bewley, W. (1999) High–temperature continuous–wave 3–61 μm "W" lasers with diamond–pressure–bond heat sinking. *Applied Physics Letters,* v.74 (8), 1075–77.

Aifer, E. (1998) CW operation of 3.4 μm optically–pumped type–II W laser to 220K. *Electronics Letters,* v.34 (16), 1587–1588, 1587–88.

Bewley, W. (1998) Continuous–wave mid–infrared VCEL's *IEEE,* v.10 (5), 660–62.

Kondow, M. (1996) GaInNAs: A novel material for long–wavelength–range laser diodes with excellent high–temperature performance. *Applied Physics,* v.35 (2b), 1273–75.

Kondow, M. (1998) Gas–source MBE of GaInNAs for long–wavelength laser diodes. *Journal of Crystal Growth,* v. 188, 255–59.

Miyoshi, S. (1998) Band structure of GaP$_{1-x}$N$_x$(x=0.25, 0.5, 0.75) ordered alloys: semiempirical tight–binding calculation. *J. of Applied Physics,* v.37, 4680–86.

Richards, D. (1995) Realization and modeling of a pseudomorphic (GaAs$_{1-x}$Sb$_x$In$_y$Ga$_{1-y}$As)/GaAs bilayer–quantum well. *Applied Physics Letters,* v.67 (18), 2639–41.

Choi, W. (1999) 1.2–μm GaAsP/InGaAs strain compensated single–quantum–well diode laser on GaAs using metal–organic chemical vapor deposition, *IEEE,* v.11 (12), 1572–74.

Bhat, R. (1998) Growth of GaAsN/GaAs, GaInAsN/GaAs and GaInAsN/GaAs quantum wells by low–pressure organometallic chemical vapor deposition. *J. of Crystal Growth,* v. 195, 427–37.

Sato, S. (1998) Metalorganic chemical vapor deposition of GaInNAs lattice matched to GaAs for long–wavelength laser diodes. *J. of Crystal Growth,* v.192, 381–85.

Friedman, D.J. (1998) Nonlinear dependence of N incorporation on In content in GaInNAs. *J. of Crystal Growth* v. 195, 438–43.

Hohnsdorf, F. (1998) Investigations of (GaIn)(Nas) bulk layers and (GaIn)(Nas)/GaAs multiple quantum well structures grown using teritarybutylarsine (TBAs) and 1,1 dimethylhydrazine (UDMHy). *J. of Crystal Growth,* v.195, 391–96.

Sato, S. (1997) Room–temperature operation of GaInNAs/GaInP double–heterostructure laser diodes grown by metalorganic chemical vapor deposition. *J. of Applied Physics,* v. 36 (5a), 2671–75.

Sato, S. (Jun. 16, 1997) Room–temperature pulsed operation of 1.3μm GaInNAs/GaAs laser diode *IEE,*.

Sato, S. (May 28, 1998) Room–temperature pulsed operation of strained GaInNAs/GaAs double quantum well laser diode grown by metal organic chemical vapour deposition. *IEE.*

Zou, Y. (1991) Characterization and determination of the band–gap discontinuity of the In$_x$Ga$_{1-x}$As/GaAs pseudomorphic quantum well. *Applied Physics Letters,* v. 58 (6), 601–03.

Kapon, E. *Semiconductor lasers II: materials and structures.* Academic Press, v.2, 71–155; 1999.

T.C. Hasenberg, R.H. Miles, A.R. Kost and L. West; Recent Advances in Sb–Based Midwave–Infrared Lasers; IEEE, vol. 33, No. 8, Aug. 1997.

E.H. Aifer, W.W. Bewley, C.L. Felix, et al.; CW Operation of 3.4pm Optically–Pumped Type–II W Laser to 220k, Electronics Letters, vol. 34, No. 16, Aug. 1998.

J.R. Meyer, C.A. Hoffman, F.J. Bartoli & L.R. Ram–Mohan; Type–II Quantum–Well Lasers for the Mid–Wavelengthnfrared. Appl. Phys. Ltr. #67, Aug. 1995.

A. Tredicucci. et al.; High Performance Interminiband Quantum Cascade Lasers with Graded Superlattices, Applied Physics Ltrs, vol. 73, No. 15, Oct. 1998.

M. Flatte, et al.; III–V Interband 5.2um Laser Operating at 185K, Appl. Phys. Letter 71 (26) Dec. 1997.

M.J. Yang, et al.; Growth and Characterisation of InAs/InGaSb/InAs/AlSb Infrared Laser Structures, Electronic Letters, Vo., 34, No. 3, Feb. 1998.

H.K. Choi, et al; 175k Continuous Wave Operation of InAsSb/InAlAsSb Quantum–Well Diode Lasers Emitting at 3.5um, Appl. Phys. Letter 68 (21), May 1996.

Bewley W. W. et al.; High–temperature continuous–wave 3–6.1 micron "W" lasers with diamond–pressure–bond heat sinking; Applied Physics Letters; vol. 74, No. 8, Feb. 22, 1999.

\* cited by examiner

METHOD AND APPARATUS FOR LONG WAVELENGTH SEMICONDUCTOR LASERS

FIELD OF THE INVENTION

The present invention relates generally to semiconductor lasers. More particularly, the present invention relates to heterojunction active regions of semiconductor lasers.

BACKGROUND OF THE INVENTION

Semiconductor lasers have become more important. One of the most important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media. A preferred component for optical interconnection of electronic components and systems via optical fibers is a semiconductor laser known as a vertical cavity surface emitting laser (VCSEL). Referring to FIG. 1A, a prior art vertical cavity surface emitting laser (VCSEL) 100 is illustrated. VCSEL 100 is cylindrical in shape and includes heterojunctions of semiconducting materials. When VCSEL 100 is lasing, a laser light is emitted from the top surface in a region defined by the optical confinement region 103. When lasing, the VCSEL 100 has a transverse mode field 108 and a longitudinal mode field 109. VCSEL 100 includes a first terminal 101 and a second terminal 102 coupled respectively to the top and bottom surfaces of the VCSEL to provide current and power. VCSEL 100 includes distributed Bragg reflector (DBR) layers 104A and 104B defining the optical confinement region 103. The optical confinement region 103 provides optical confinement such that the light can be reflected between the DBR layers 104A and 104B in a reinforcing manner to provide light amplification. The optical confinement region 103 is a cylindrical region having a diameter of D. VCSEL 100 includes heterojunction semiconductor layers 105. The region of the heterojunction semiconductor layers 105 which overlaps with the optical confinement region is referred to as the active region 106. The active region 106 provides current confinement so as to provide lasing when a threshold current is supplied to the VCSEL 100. Threshold current is the current level required for injecting enough carriers (electrons and holes) for lasing to occur. The frequency and wavelength of the light emitted from a VCSEL is a function of the structure and composition of materials of the active region 106. The typical structure of the heterojunction semiconductor layers 105 and active region 106 includes one or more pairs of quantum wells. Quantum wells are formed from joining particular semiconductor materials having a thickness of around one hundred Angstroms or less where the quantum confinement effects become important. Under quantum confinement effects, the effective bandgap of the quantum well material increases with decreasing thickness. Surrounding the one or more pairs of quantum wells are semiconductor materials that provide cladding and barriers. Quantum wells are key components in laser diodes in that they can strengthen electro-optical interactions by confining carriers to small regions.

To improve optical confinement, index guiding may be used. Index guiding uses layers of different compounds and structures to provide a real refractive index profile to guide the light. Alternatively a VCSEL may be gain guided. In gain guiding, the carriers induce a refractive index difference which is a function of the laser current level and output power.

VCSELs emit a coherent light beam of light from the surface of the wafer in which they are fabricated owing to the presence of the vertical optical cavity (the optical confinement region 103) formed by the two distributed Bragg reflectors (DBR) 104A and 104B on either side of a gain region (the active region 106). VCSELs are most often formed by epitaxial growth of the DBRs 104A and 104B and the active region 106 on a single crystal semiconductor wafer. In a VCSEL, the number of defects in its layers is minimized when they are grown on a substrate with the same lattice constant and crystal structure. To manufacture a VCSEL in this manner, there are a limited number of materials that can be incorporated into VCSEL devices that have the high performance properties required for lasing. The DBRs 104A and 104B in VCSEL 100 typically consists of alternating quarter wavelength thick layers of materials with different indices of refraction. The larger the difference in index of refraction, the fewer will be the number of layers required to achieve the necessary reflectivity. Gallium-Arsenide/Aluminum-Gallium-Arsenide (GaAs/AlGaAs) materials have to present been the most successful for use in VCSEL structures due to their wide differences in refractive indices. While GaAs/AlGaAs materials are the preferred materials for the DBRs 104A and 104B, they are not suitable for fabricating an active region 106 providing photon emission at longer wavelengths, such as the 1.3 $\mu$m or 1.55 $\mu$m wavelength standards that are well suited to optical fiber loss and dispersion minima. Heretofore, there have been no suitable materials or composition of materials in which to fabricate VCSELs at these longer wavelengths such as the 1.3 $\mu$m or 1.55 $\mu$m wavelength standards.

Prior art attempts to fabricate 1.3 $\mu$m VCSELs on GaAs have focused on replacing the active region 106 with new heterojunction semiconductor layers 105 of material that emit photons at wavelengths of 1.3 $\mu$m. These attempts include providing Gallium-Arsenide-Antimonide (GaAsSb) quantum wells, Gallium-Indium-Nitrogen-Arsenide (GaInNAs) quantum wells, or Indium-Arsenide (InAs) or Indium-Gallium-Arsenide (InGaAs) quantum dot active regions. In the case of the GaAsSb quantum wells, the thickness of the quantum well layer and its Antimony (Sb) composition need to be maintained below the elastic strain limit to avoid defect formation. This constraint also limits the achievable photon emission wavelength to less than the desired 1.3 $\mu$m. GaInNAs quantum wells can in principle be grown to emit at 1.3 $\mu$m with arbitrary thicknesses on GaAs substrates, if, the Indium (In) and Nitrogen (N) compositions can be controlled to match the lattice constant of GaAs. However, the limitation in Nitrogen (N) composition has limited the photon emission wavelength to less than the desired 1.3 $\mu$m. Regarding InAs or InGaAs quantum dot active regions, current manufacturing is unable to achieve high enough density of dots in order to sustain laser operation in a VCSEL.

Increased strain in the materials of the heterojunction 105 and active region 106 of semiconductor lasers has been used to reduce threshold currents and optical losses. Strain is generally produced by changing the concentration ratio of atoms forming the materials of the heterojunction 105. There are two types of strain in the materials, tensile strain and compressive strain. Cladding layers of the quantum well are usually lattice matched to the substrate with respect to strain while the barrier layers may have the opposite strain of the quantum well layer. Strained layer quantum well structures may be employed to try to achieve longer wavelength emission of photons. However, with the increased strain in the quantum well, there is a growth in lattice mismatched active regions which presents limits to the achievable wavelength ranges. For example, consider InGaAs or GaAsSb quantum wells used alone as the active region, which are limited to a laser emission wavelength between 1.1 and 1.25 $\mu$m respectively. As the In or Sb composition is increased the layer thickness must be decreased in order to remain within the elastic strain limit. Unfortunately, the quantization energy in the quantum well increases approximately quadratically as the well thickness decreases and thus the emission wavelength saturates. Recently the possibility of using strain compensation and graded quantum wells to extend the emission wavelength of InGaAs quantum wells has been explored. However, this approach only enabled the extension of the emission wavelength to 1.2 $\mu$m. Further increases in the photon emission wavelength using this approach appear unfeasible.

It is desirable to overcome the limitations in the prior art and provide new heterojunction semiconductor layers of material that can provide an active region which can lase at a wavelength of 1.3 $\mu$m or more.

BRIEF SUMMARY OF THE INVENTION

Briefly, the present invention includes a method, apparatus and system as described in the claims. A W quantum well structure is provided by the present invention to enhance the active region of semiconductor lasers in order to provide long wavelength emission of photons. The W quantum well structure is expanded to an alternate embodiments of Type II multiple quantum wells. The present invention provides an active region, incorporating the W quantum well structure, for semiconductor lasers with energy band lineups in heterostructures to achieve emission at wavelengths of 1.3 $\mu$m or greater. Application of the active region to a basic laser diode device, a VCSEL, and exemplary materials are disclosed which can be used to achieve lasing at wavelengths of 1.3 $\mu$m and greater. The active region is comprised of one or more sets of triad layers of $GaAs_{1-x}N_x/GaAs_{1-y}Sb_y/GaAs_{1-x}N_x$ to provide the W quantum well structure. The energy band of these materials provides a staggered band alignment which causes electrons and holes to be confined in adjacent layers to one another. Because the wavefunctions associated with these materials tunnel into the adjacent layers, optical emission at a longer wavelength is achievable than otherwise available from the energy gaps of the constituent materials alone.

BRIEF DESCRIPTIONS OF THE DRAWINGS

Figure 1:
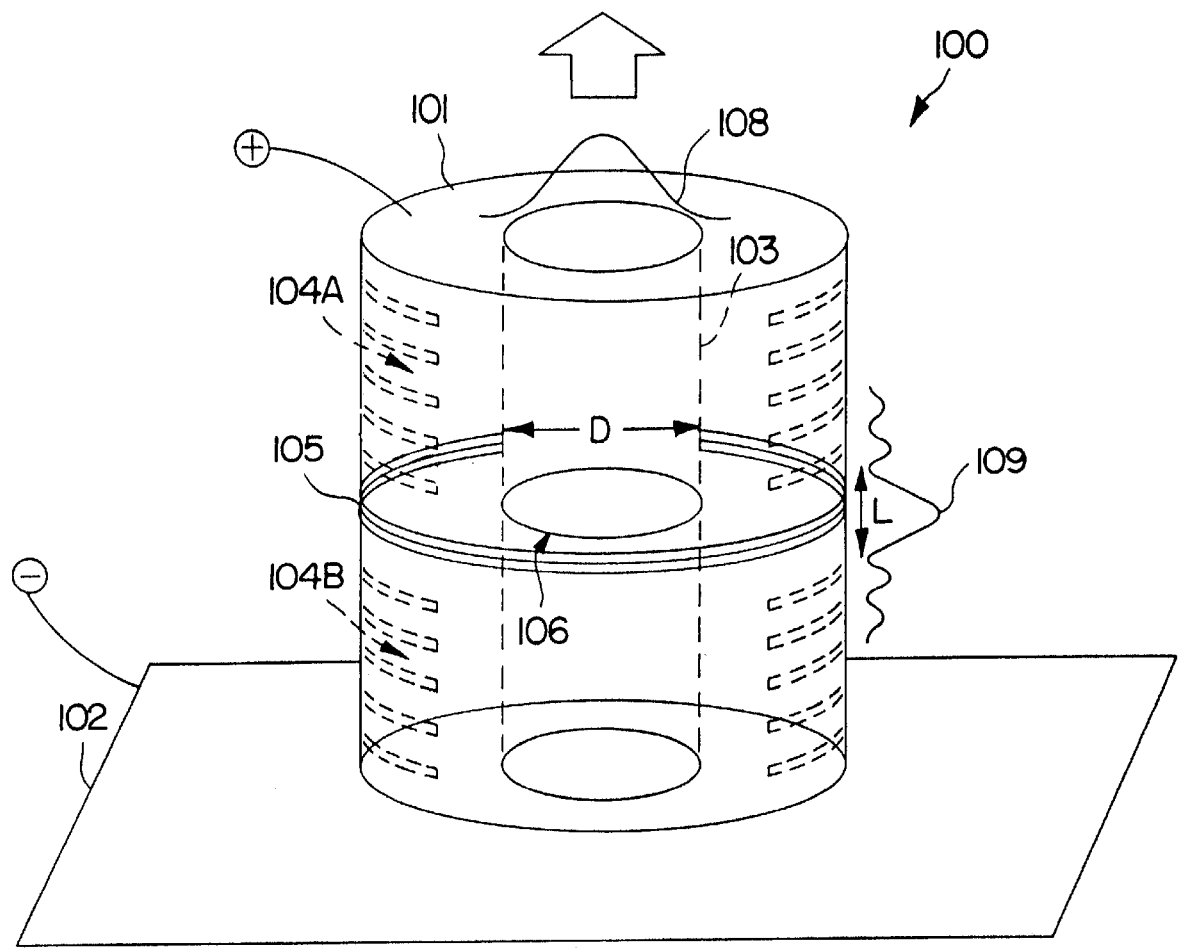
FIG. 1 is a three dimensional diagram of a prior art VCSEL.

Like reference numbers and designations in the drawings indicate like elements providing similar functionality. A letter after a reference designator number represents an instance of an element having the reference designator number. Punctuation marks after a reference designator represent a differing element.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

A new quantum well structure is provided by the present invention to enhance the active region of semiconductor lasers in order to provide long wavelength emission of photons. Longer wavelength semiconductor laser diodes improve fiber optic communication systems by overcoming deficiencies in fiber optic fibers that are sensitive in the shorter wavelengths of photon emissions. The new quantum well structure of the present invention overcomes the shortcomings of the prior art by using an active region that relies on energy band lineups in heterostructures to achieve emission at 1.3 $\mu$m and longer, rather than the absolute value of energy gaps. The new quantum well structure employs advances of the last few years in the design, fabrication and implementation of so-called staggered offset or type II heterojunction laser diode devices, particularly mid IR laser semiconductor diodes. A basic device concept and example materials which can be used for 1.3 $\mu$m and longer VCSELs is disclosed. The active region of the device is comprised of one or more sets of triad layers of $GaAs_{1-x}N_x/GaAs_{1-y}Sb_y/GaAs_{1-x}N_x$ to provide the new quantum well structure. The energy band of these materials provides a staggered band alignment. The staggered band alignment causes electrons and holes to be confined in adjacent layers to one another. Because the wavefunctions associated with these materials tunnel into the adjacent layers, it is possible to achieve optical emission at longer wavelength than the energy gaps of the constituent materials.

Figure 2A:
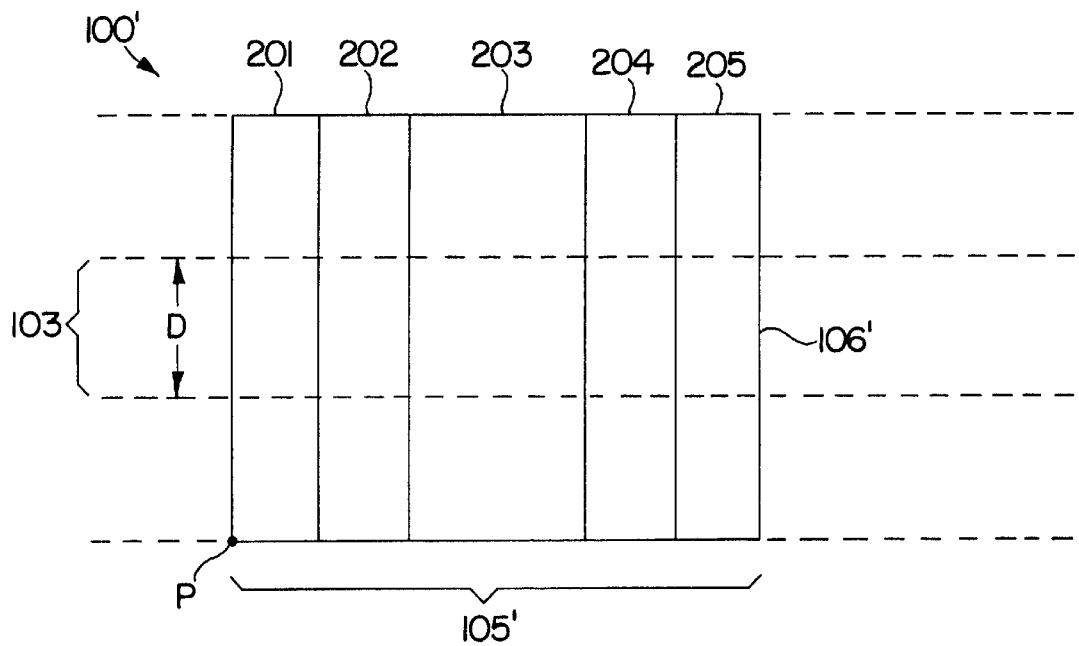
FIG. 2A is a cross sectional view of the heterojunction semiconductor layers forming the active region having the W-shaped quantum well system of a first embodiment of the present invention.

Referring now to FIG. 2A, a structure of heterojunction semiconductor layers 105' of materials of the present invention with one set of triad layers $GaAs_{1-x}N_x/GaAs_{1-y}Sb_y/GaAs_{1-x}N_x$ is illustrated. The layers 105' provide the new quantum well structure referred to as the W quantum well which is a type II quantum well structure. FIG. 2A illustrates heterojunction semiconductor layers 105' and VCSEL 100' turned sideways in comparison with layers 105 of VCSEL 100 in FIG. 1. From reference point P, the first layer of layers 105' is GaAs 201 which is approximately twenty five angstroms thick. GaAs 201 acts both as a cladding and barrier material for the quantum wells of layers 105' and active region 106'. The second layer of layers 105' is Gallium-Arsenide-Nitride (GaAs$_{1-x}$N$_x$) 202, with the ratio of atoms indicated by the subscript x which can vary over the range of 0.01 to 0.3. The thickness of GaAs$_{1-x}$N$_x$ 202 is variable depending upon the desired properties of the semiconductor laser but in the preferred embodiment it is approximately thirty angstroms. The layer of GaAs$_{1-x}$N$_x$ 202 acts as an electron well for electrons and a hole barrier for holes. The layer of GaAs$_{1-x}$N$_x$ 202 is the central layer for the first quantum well of a pair of quantum wells in the W quantum well materials structure. The third layer of layers 105' is Gallium-Arsenide-Antimonide (GaAs$_{1-y}$Sb$_y$) 203, with the ratio of atoms indicated by the subscript y which can vary over the range of 0.01 to 0.5. The thickness of GaAs$_{1-y}$Sb$_y$ 203 is also variable depending upon the desired properties of the semiconductor laser but in the preferred embodiment it is approximately fifty angstroms. The layer of GaAs$_{1-y}$Sb$_y$ 203 acts as an electron barrier and a hole well located between the pair of quantum wells formed from GaAs$_{1-x}$N$_x$. The fourth layer of layers 105' is Gallium-Arsenide-Nitride (GaAs$_{1-x}$N$_x$) 204 which is similar to the second layer of layers 105', GaAs$_{1-x}$N$_x$ 202. The GaAs$_{1-x}$N$_x$ 204 is the central layer of the second quantum well of the pair of quantum wells. The layer of GaAs$_{1-x}$N$_x$ 204 also acts as an electron well for electrons and a hole barrier for holes. The thickness and ration of atoms of GaAs$_{1-x}$N$_x$ 204 is similar to the thickness and ratio of atoms of GaAs$_{1-x}$N$_x$ 202 depending upon the desired properties of the semiconductor laser. The thickness of GaAs$_{1-x}$N$_x$ 204 in the preferred embodiment is approximately thirty angstroms. The layers 105' and active region 106' of the semiconductor laser may have additional sets of triad layers of GaAs$_{1-x}$N$_x$/GaAs$_{1-y}$Sb$_y$/GaAs$_{1-x}$N$_x$. The final layer of layers 105' is GaAs 205, similar to GaAs 201, which is approximately twenty five angstroms thick. GaAs 205 also acts both as a cladding and barrier material for the quantum wells of layers 105' and active region 106'. The quantum well structure of layers 105' is referred to herein as a W quantum well (WQW). The heterojunction semiconductor layers 105' of the active region 106' constructing the W quantum well can be formed in a number of ways including molecular beam epitaxy (MBE) and metal organic chemical vapor deposition (MOCVD).

Figure 2B:
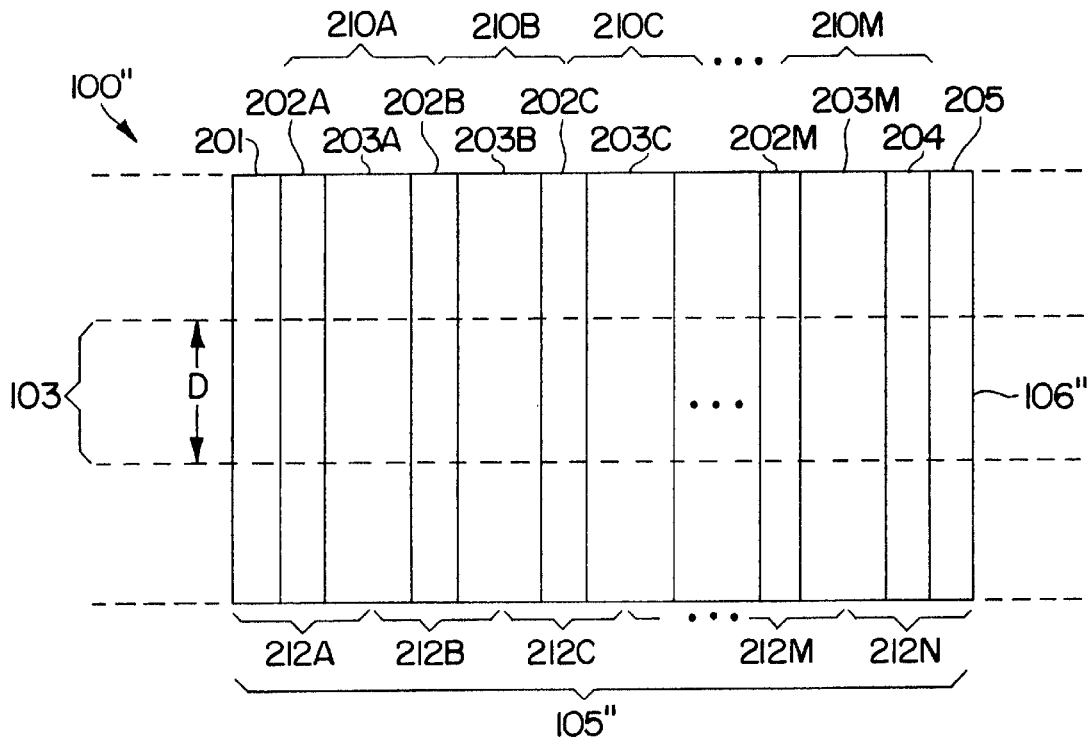
FIG. 2B is a cross sectional view of a semiconductor laser having multiple W quantum wells of the present invention.

Referring now to FIG. 2B, the W quantum well structure is expanded to a structure having multiple Type II quantum wells. The structure of heterojunction layers 105" of materials of the present invention with multiple sets of triad layers GaAs$_{1-x}$N$_x$/GaAs$_{1-y}$Sb$_y$/GaAs$_{1-x}$N$_x$ is illustrated in FIG. 2B. Heterojunction layers 105" includes GaAs layers 201 and 205 sandwiching materials forming M multiple type II hole well structures 210A–210M and N multiple type II electron well structures 212A–212N. The optical confinement region 103 overlapping the heterojunction layers 105" forms the active region 106". The hole well structure 210A includes GaAsN layer 202A and GaAsSb layer 203A and a portion of GaAsN layer 202B of the next hole well structure 210B. The hole well structure 210B includes GaAsN layer 202B, GaAsSb layer 203B and a portion of GaAsN layer 202C of the next hole well 210C. The hole well layer for confining holes is the GaAsSb layer 203A and GaAsSb layer 203B respectively. The electron well structure 212A includes GaAs layer 201, GaAsN layer 202A, and GaAsSb layer 203A.

The electron well structure 212B includes GaAsSb layer 203A, GaAsN layer 202B, and GaAsSb layer 203B. The electron well layer for confining electrons is the GaAsN layer 202A and the GaAsN layer 202B respectively. The multiple type II quantum well structure can be completed by repeating the triad layers of GaAs$_{1-x}$N$_x$/GaAs$_{1-y}$Sb$_y$/GaAs$_{1-x}$N$_x$ from the W quantum well structure until the last of the multiple hole and electron wells are formed. The last hole well structure 210M includes GaAsN layer 202M, GaAsSb layer 203M and GaAsN layer 204 while the last electron well structure 212N includes GaAsSb layer 203M, GaAsN layer 204, and GaAs layer 205. In the multiple hole and electron well structures, interior GaAsN layers, such as layers 202B, 202C and 202M, are shared by adjacent hole well structures while layers 203A, 203B, 203C, and 203M are shared by adjacent electron well structures. In the type II quantum well structure of the present invention, both hole well structures 210A–210M and electron well structures 212A–212N are formed. While the hole wells are formed from the triad layers of GaAs$_{1-x}$N$_x$/GaAs$_{1-y}$Sb$_y$/GaAs$_{1-x}$N$_x$ with holes being confined in the hole well layer of GaAs$_{1-y}$Sb$_y$, electron wells are formed from the triad layers of GaAs$_{1-y}$Sb$_y$/GaAs$_{1-x}$N$_x$/GaAs$_{1-y}$Sb$_y$. or triad layers of GaAs/GaAs$_{1-x}$N$_x$/GaAs$_{1-y}$Sb$_y$. or in reversed order of GaAs$_{1-y}$Sb$_y$./GaAs$_{1-x}$N$_x$/GaAs with electrons being confined in the electron well layer of GaAs$_{1-x}$N$_x$. This multiple type II quantum well structure can enhance the gain of the semiconductor laser to alleviate a reduction in gain due to less overlap between electron and hole wavefunctions.

Figure 3:
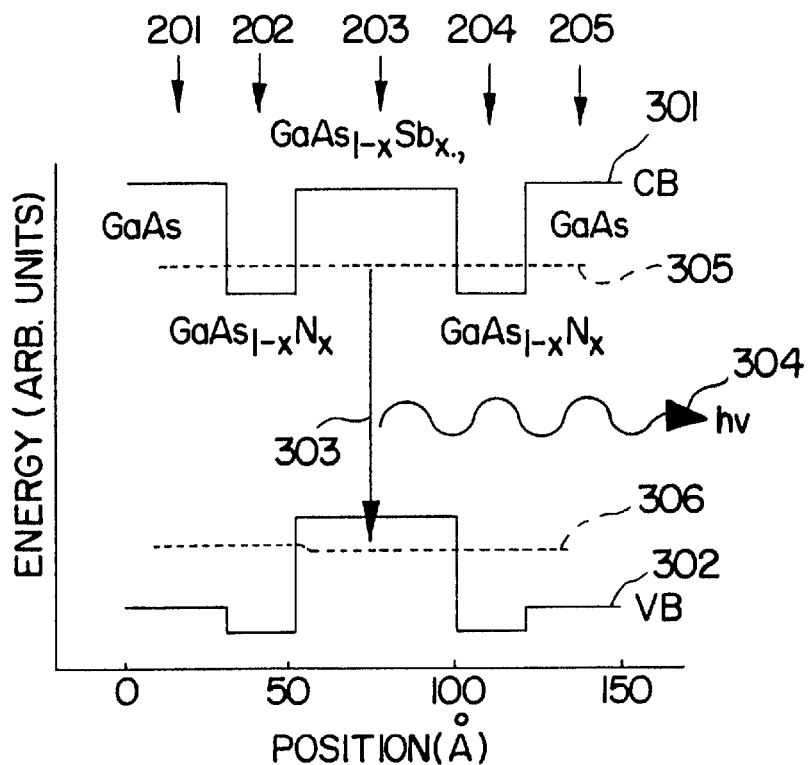
FIG. 3 is an energy band diagram illustrating the optical transition and staggered energy band lineup in the W-shaped quantum well of the first embodiment of the present invention.

Referring now to the energy band diagram of FIG. 3, the conduction band 301 and the valence band 302 are estimated for the layers 105' and active region 106' illustrated in FIG. 2A. The zero position along the X-axis in FIG. 3 corresponds to position P along the X-axis of FIG. 2A. This alignment in energy bands is estimated for the material system of layers 105' and active region 106' of FIG. 2A having an N concentration of 3%, where subscript x is 3%, and an Sb concentration of 30%, where subscript y is 30%. Other atom concentrations of N and Sb may be used. The quantum well structure results in the shape of the conduction band 301 being similar to the letter W near the light emitting region and thus is referred to as a W quantum well (WQW). The expected optical transition 303 is also illustrated in FIG. 3 generating a photon 304 having an energy of hν, where ν equals the speed of light divided by the wavelength (c/λ). Thus, for longer wavelengths of desired emission, it is desirable to have lasing occur within a semiconductor diode with lower energy photons.

The staggered alignment of the energy bands for these materials causes electrons and holes to be confined in adjacent layers to one another. Electrons are localized in the GaAsN layers 202 and 204 and holes are localized in the GaAsSb layer 203. The conduction band offset that confines the electrons in the GaAsN layers 202 and 204, contributes to localization of the electron. As a result, the electron energy states are quantized and lie at an electron energy level 305 which is greater than the conduction band minimum of the conduction band 301. Similarly, the holes are confined forming hole states that are quantized in the GaAsSb layer 203 resulting in a hole energy level 306 which is less than the valence band maximum of the valence band 302, although the energy shift is smaller for holes. In spite of this localization, there is considerable tunneling of the electron states into the GaAsSb layer 203 that, under proper design, can result in significant spatial overlap between electron and hole wavefunctions.

Figure 4:
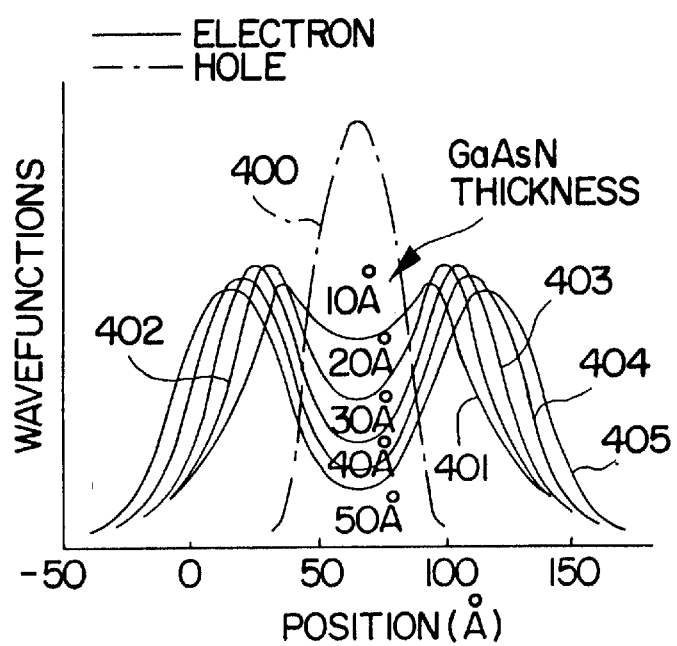
FIG. 4 is a wavefunction diagram illustrating the electron and hole wavefunctions for the W-shaped quantum well system of the present invention.

Referring now to FIG. 4, the hole wave function $\psi_h$ 400 and various electron wavefunctions $\psi_e$ 401–405 are illustrated for the W quantum well structure of FIG. 2A. The position of materials in FIG. 4 does not exactly coincide with the position of materials in FIGS. 2 and 3, due to the variations in thicknesses of the GaAsN layers. The overlap in the hole wavefunction and the electron wavefunction is the interaction that permits efficient optical emission and gain to occur for a semiconductor laser. It is desirable to maximize the overlap between the hole wavefunction and the electron wavefunction in order to maximize the recombination of holes and electrons to produce photons. The greater the overlap between the hole and electron wavefunctions generally means the higher gain achievable within the semiconductor laser. The various electron wavefunctions $\psi_e$ 401–405 plotted in FIG. 4 are a function of the thickness of the GaAsN layers 202 and 204. Electron wavefunctions $\psi_e$ 401, 402, 403, 404 and 405 correspond respectively to thicknesses for the GaAsN layers 202 and 204 of ten, twenty, thirty, forty, and fifty angstroms. The electron wavefunction $\psi_e$ 401 provides a larger overlap with the hole wavefunction $\psi_h$ 400. Thus, the energy positions of the states involved are not only a function of the selected materials but are also a function of the layer thicknesses of the W quantum well. Therefore, depending upon the selection of thicknesses, a wide range of emission wavelengths is possible in the materials system (the triad layers of $GaAs_{1-x}N_x/GaAs_{1-y}Sb_y/GaAs_{1-x}N_x$) of the W quantum well. As illustrated in FIG. 4, the wavefunctions tunnel into the adjacent layers of materials. Therefore, it is possible to achieve optical emission at longer wavelengths than from the energy gaps of the constituent materials alone.

Figure 5:
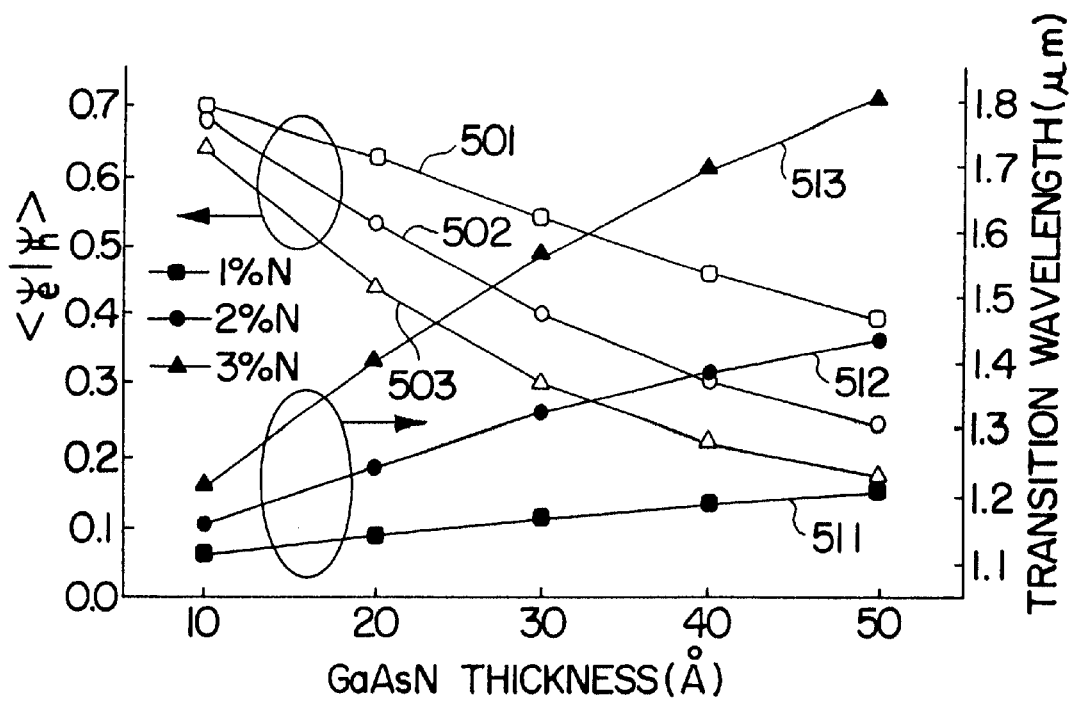
FIG. 5 is a combined graph of the achievable transition wavelengths and the wavefunction of electrons and holes versus the GaAsN quantum well thickness for the W-shaped quantum well system of the present invention.

Referring now to FIG. 5, a chart estimating the range of emission energies that can be achieved with the materials system of the W quantum well structure of FIG. 2A is illustrated. The chart in FIG. 5 combines the plots of wavefunction overlap ($\psi_e/\psi_h$) and emission energy (h$\psi$ or wavelength $\lambda$ where $\nu$ equals $c/\lambda$) for various thicknesses of GaAsN material. Curves 501, 502 and 503 illustrate the wavefunction overlap versus GaAsN 202 and 204 thickness for N compositions of 1%, 2%, and 3% respectively. Curves 511, 512 and 513 illustrate the energy (wavelength) versus GaAsN 202 and 204 thickness for N compositions of 1%, 2%, and 3% respectively. As can be seen in FIG. 5, the concentration of N is very important to the photon emission of the semiconductor laser having a W quantum well structure. The energies illustrated in FIG. 5 are estimated on the basis of known energy band parameters and offsets as well as linear interpolations between the end points in composition ranges. In the case of the band offsets between GaAsSb 203 and GaAsN 202 and 204, the transivity rule is used in which the valence band offsets between each of the constituents with GaAs 201 and 205 is used to calculate the offset between them. Because some of the information for the energy estimates is incomplete or controversial, the most conservative estimate of the offset regarding the potential for long wavelength emission has been used. The W quantum well structure and materials system has the potential for emission and laser operation over the range of energies having wavelengths from 1.2 to 1.7 $\mu$m. As the wavelength increases, however, the spatial overlap between the electron and hole states decreases owing to greater localization of the electron and holes in their respective confining potentials. In other words, to achieve longer wavelength emission of photons it is desirable to decrease the energy difference (h$\nu$) which in turn reduces the overlap between the hole and electron wavefunctions. Nonetheless, it is possible to achieve emission at 1.3 $\mu$m with more than 50% spatial overlap (see 3% N concentration with a GaAsN thickness of 15 angstroms). While 50% spatial overlap is expected to provide a reduced gain over other quantum well structures, this can be compensated by utilizing additional sets of the triad layers of $GaAs_{1-x}N_x/GaAs_{1-y}Sb_y/GaAs_{1-x}N_x$ of the W quantum well structure. The W quantum well provides a feasible migration path to 1.55 $\mu$m wavelength VCSEL's on GaAs substrates if suitable material parameters are chosen.

One advantage to the triad layers of $GaAs_{1-x}N_x/GaAs_{1-y}Sb_y/GaAs_{1-x}N_x$ of the W quantum well is that lasing can occur in semiconductor lasers with the emission of photons having long wavelengths between 1.2 to 1.7 microns. Another advantage to the triad layers of $GaAs_{1-x}N_x/GaAs_{1-y}Sb_y/GaAs_{1-x}N_x$ of the W quantum well is that they are compatible with the well developed AlGaAs/GaAs epitaxial mirror technology.

Another advantage of the W quantum well materials system is that strain management is automatically accomplished because GaAsN is tensile strained while GaAsSb is compressively strained. This results in alternately strained material between adjacent layers. GaAsN is the only III–V material with a smaller energy gap than GaAs that has a smaller lattice constant as well. This results from the strong bowing of the energy gap in this material. Thus, the combined triad layers of $GaAs_{1-x}N_x/GaAs_{1-y}Sb_y/GaAs_{1-x}N_x$ of the W quantum well are more weakly strained than single quantum wells would be and additional sets of triad layers can be incorporated into a semiconductor laser in order to compensate for an expected reduced gain without exceeding the elastic strain limit of the materials. The concentration of Nitride and Antimony can effect the strain placed on the materials of W quantum wells. Thus, an even longer wavelength may be achieved by increasing the strain on the materials of the W quantum well.

Figure 6A:
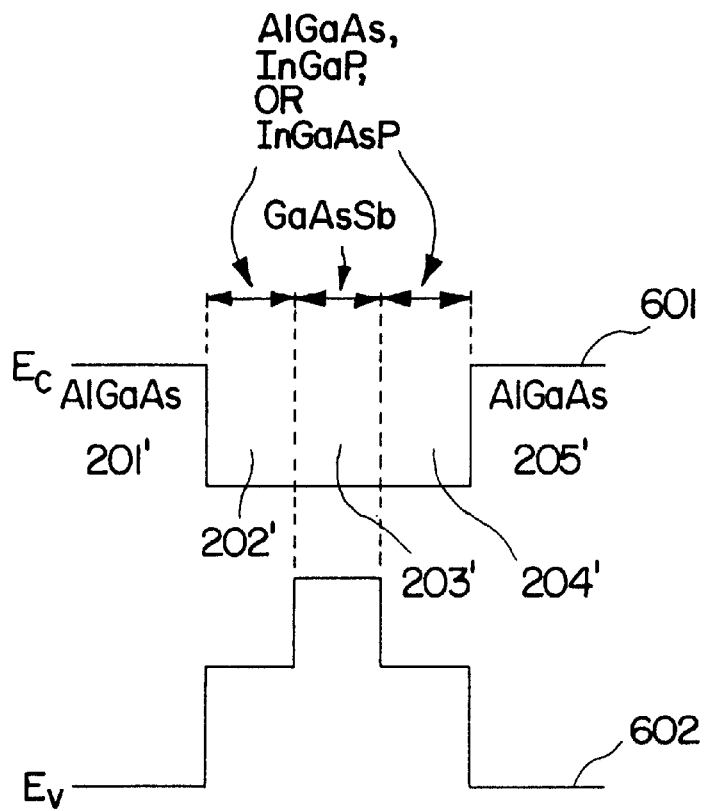
FIG. 6A is an energy band diagram illustrating an alternate embodiment of a quantum well structure for the present invention for providing photon emission at long wavelengths.

Referring now to the energy band diagram of FIG. 6A, a conduction band 601 and a valence band 602 for an alternate embodiment of the W quantum well for the heterojunction 105' and active region 106' is illustrated. In this alternate embodiment, the first layer is Aluminum-Gallium-Arsenide (AlGaAs) 201'. The AlGaAs 201' acts both as a cladding and barrier material for the W quantum well structure. The second layer, layer 202', is one of a set of three materials. Layer 202' may be Aluminum-Gallium-Arsenide (AlGaAs) with a percentage of Aluminum being less than that of the first layer of AlGaAs 201', Indium-Gallium-Phosphide (InGaP), or Indium-Gallium-Arsenide-Phosphide (InGaAsP). The energy bands 601 and 602 in FIG. 6A are illustrated with the second layer, layer 202', being Indium-Gallium-Arsenide-Phosphide (InGaAsP). The third layer is Gallium-Arsenide-Antimonide (GaAsSb) 203'. The layer of GaAsSb 203' which is acting as a hole well in FIG. 6A. Depending upon the AlGaAs or InGaAsP composition in layer 202' and 204' or GaAsSb composition in layer 203', the layer of GaAsSb 203' may become an electron barrier as well. The fourth layer of the active region illustrated in FIG. 6A, layer 204', is similar to the second layer, layer 202'. The fourth layer, layer 204', is one of a set of three materials. Layer 204' may be Aluminum-Gallium-Arsenide (AlGaAs) with a percentage of Aluminum being less than that of the first layer of AlGaAs 201', Indium-Gallium-Phosphide (InGaP), or Indium-Gallium-Arsenide-Phosphide (InGaAsP). The energy bands 601 and 602 illustrated in FIG. 6A are with the fourth layer, layer 204', being Indium-Gallium-Arsenide-Phosphide (InGaAsP). The layers of the active region of the alternate embodiment illustrated by FIG. 6A can be expanded by adding additional layers in a manner similar to that of FIG. 2B but with different materials. The heterojunction layers 105' and active region 106' of the semiconductor laser may have additional sets of triad layers of InGaAsP/GaAsSb/InGaAsP; InGaP/GaAsSb/InGaP; or AlGaAs/GaAsSb/AlGaAs as the case may be with final layer being AlGaAs 205', similar to AlGaAs 201'. AlGaAs 205' also acts both as a cladding and barrier material.

In the alternate embodiment illustrated by FIG. 6A, holes are confined to the narrower region of the hole well provided by the GaAsSb 203' than the electrons in the electron well provided by layers 202', 203' and 204'. This is because the conduction band offset in the conduction band 601, between the conduction band 601 at layer 203' and the conduction band 601 at the two adjacent layers 202' and 204', is smaller than kT or substantially zero. The materials for layers 201' through 205' are selected to have the appropriate composition to create this small or substantially zero conduction band offset. The electrons being confined to the larger volume defined by the electron well formed of layers 202', 203', and 204', have a reduced quantization energy. As a result, the material will emit photons at energies and wavelengths close to the energy gap of the GaAsSb 203'. By selecting a composition of materials for layers 201' through 205' with a small enough energy gap, emission at wavelengths in the range from 1.2 µm to 1.75 µm can be achieved.

Figure 6B:
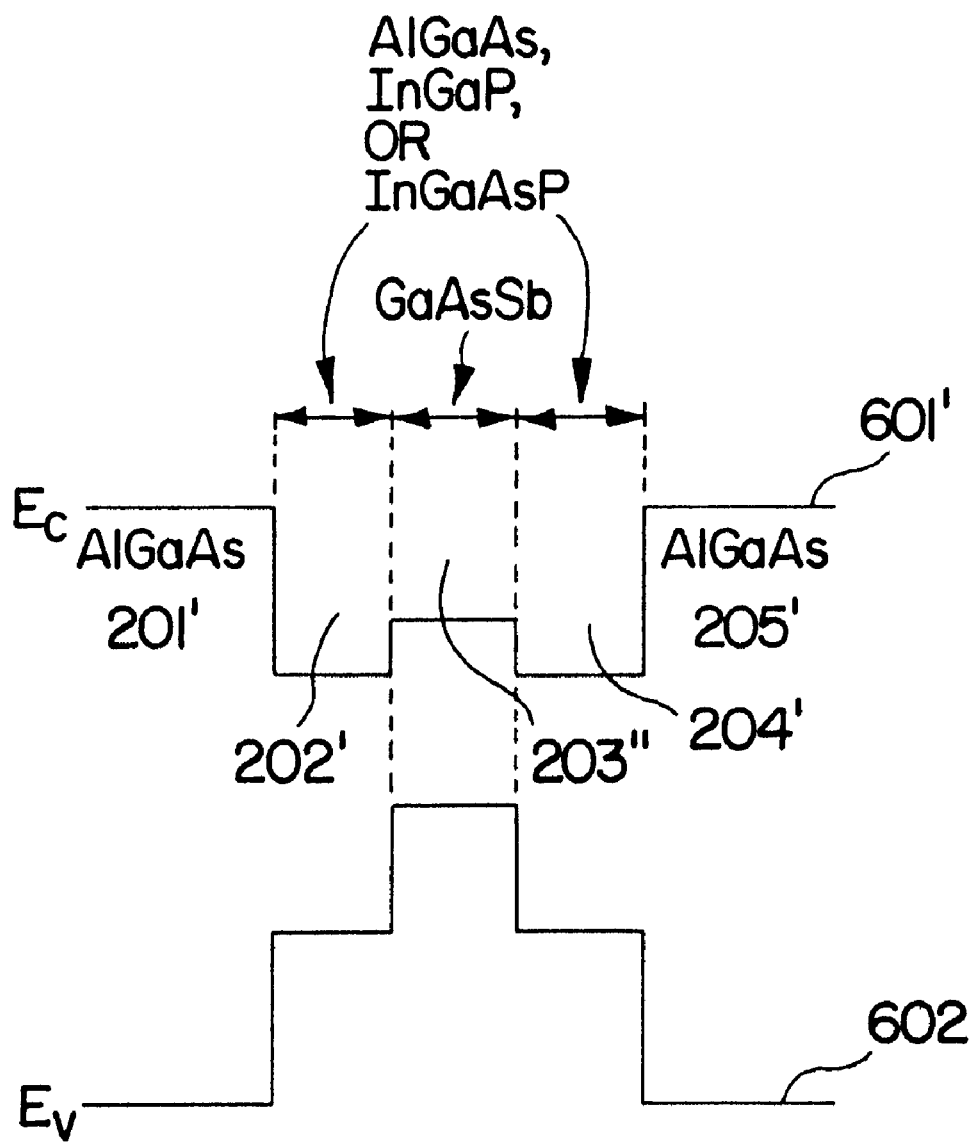
FIG. 6B is an energy band diagram illustrating a modification of the alternate embodiment of FIG. 6A for providing photon emission at long wavelengths.

In the materials represented in FIG. 6A, the second, third, and fourth layers (202' through 204'), act as one large electron well for electrons. Alternatively, if the composition of the second layer and the fourth layer AlGaAs or InGaAsP, or the third layer, layer GaAsSb 203', is varied, the third layer, GaAsSb, may become an electron barrier. Referring now to FIG. 6B, the conduction band 601' is modified from the conduction band 601 due to a different composition of AlGaAs or InGaAsP in the second and the fourth layer, or of GaAsSb in the third layer 203". The selected material composition in the second, third and the fourth layers causes the third layer, GaAsSb, to become an electron barrier as illustrated by the increase in the conduction band level from 601 at 203' in FIG. 6A to 601' at 203" in FIG. 6B. This causes the electrons to become concentrated into two electron wells at the second layer 202' and the fourth layer 204'. The composition of materials for layers 201' through 205' may still be selected having a small enough energy gap due to electron wave function tunneling through the third layer, GaAsSb, such that photon emission at relatively long wavelengths in the range from 1.2 µm to 1.75 µm can be achieved. Additional benefits may be obtained by expanding the number of layers shown in FIG. 6B. The layers of the active region of the alternate embodiment illustrated by FIG. 6B can be expanded by adding additional layers in a manner similar to that of FIG. 2B but with different materials.

The preferred embodiments of the present invention are thus described. The present invention has been described with relationship to VCSELs but is applicable to any type of semiconductor laser. While the present invention has been described in particular embodiments, the present invention should not be construed as limited by such embodiments, but rather construed according to the claims that follow below.

What is claimed is:

1. A semiconductor laser for emitting photons at relatively long wavelengths, the semiconductor laser comprising:

a semiconductor substrate;

one or more sets of a triad of active layers over the semiconductor substrate, the one or more sets of the triad of active layers forming a W quantum well structure to provide carrier confinement for lasing, the W quantum well structure having a conduction band shaped similar to a letter W near a light emitting region to emit photons at relatively long wavelengths;

an optical confinement region formed around the one or more sets of the triad of active layers, the optical confinement region to confine photons to an active region within the one or more sets of the triad of active layers; and a first contact terminal and a second contact terminal, the first contact terminal joined to a surface of the semiconductor laser to allow emission of photons therefrom, the second contact terminal joined to the semiconductor substrate.

2. The semiconductor laser of claim 1 wherein, the semiconductor laser is a vertical cavity surface emitting laser (VCSEL) and the photons are emitted from a surface of the VCSEL, the surface of the VCSEL parallel with the one or more sets of the triad of active layers.

3. The semiconductor laser of claim 1 wherein, the semiconductor laser is electrically pumped through the first and second contact terminals.

4. The semiconductor laser of claim 1 wherein, the semiconductor laser to emit photons having a wavelength ranging from 1.2 microns to 1.7 microns.

5. The semiconductor laser of claim 1 wherein, the semiconductor laser to emit photons having a wavelength of approximately 1.3 microns.

6. The semiconductor laser of claim 1 wherein, the W quantum well structure has an energy band including a conduction band and a valence band forming an energy gap shaped similar to a letter W.

7. The semiconductor laser of claim 6 wherein, the W quantum well structure has an electron wavefunction and a hole wavefunction that overlap to achieve optical emission at longer wavelengths than from the energy gaps of the constituent materials alone.

8. The semiconductor laser of claim 1 wherein, the W quantum well structure has an energy band including a conduction band and a valence band forming an energy gap small enough to achieve photon emissions at wavelengths over the range of 1.2 microns to 1.7 microns.

9. The semiconductor laser of claim 1 further comprising:

a first barrier layer and a second barrier layer joined to and sandwiching the one or more sets of the triad of active layers there-between.

10. The semiconductor laser of claim 2 wherein, the optical confinement region is formed by a first distributed Bragg reflector and a second distributed Bragg reflector, and the one or more sets of the triad of active layers are located between the first distributed Bragg reflector and the second distributed Bragg reflector.

11. A semiconductor laser for emitting photons at relatively long wavelengths, the semiconductor laser comprising:

a semiconductor substrate;

active layers over the semiconductor substrate, the active layers forming a W quantum well structure to provide carrier confinement for lasing, the W quantum well structure having electron wells and hole wells forming an energy band that reduces an energy gap between a conduction band and a valence band to emit photons at relatively long wavelengths, the W quantum well structure comprises a first barrier layer and a triad of layers of Gallium-Arsenide-Nitride/Gallium-Arsenide-Antimonide/Gallium-Arsenide-Nitride and a second barrier layer, the first and second barrier layers each adjacent to one of the Gallium-Arsenide-Nitride layers;

an optical confinement region formed around the active layers, the optical confinement region to confine photons to an active region within the active layers; and a first contact terminal and a second contact terminal, the first contact terminal joined to a surface of the semiconductor laser to allow emission of photons therefrom, the second contact terminal joined to the semiconductor substrate.

12. The semiconductor laser of claim 11 wherein,
the first barrier layer and the second barrier layer are Gallium-Arsenide.

13. The semiconductor laser of claim 11 wherein,
the Arsenide concentration varies as a percentage of (1−X) and the Nitride concentration varies as a percentage of X in each of Gallium-Arsenide-Nitride layers and the Arsenide concentration varies as a percentage of (1−Y) and the Antimony concentration varies as a percentage of Y in the Gallium-Arsenide-Antimonide layer.

14. The semiconductor laser of claim 12 wherein,
the Gallium-Arsenide of the first and second barrier layers can range between ten and one hundred angstroms in thickness and the Gallium-Arsenide-Antimonide layer can range between ten and one hundred angstroms in thickness.

15. The semiconductor laser of claim 14 wherein,
the Gallium-Arsenide-Nitride layers can range between ten and one hundred angstroms in thickness.

16. The semiconductor laser of claim 12 wherein,
the Gallium-Arsenide of the first and second barrier layers is approximately twenty five angstroms in thickness and the Gallium-Arsenide-Antimonide layer is approximately fifty angstroms in thickness.

17. The semiconductor laser of claim 16 wherein,
the Gallium-Arsenide-Nitride layers are approximately twenty five angstroms in thickness.

18. The semiconductor laser of claim 12 wherein,
the Gallium-Arsenide layers of the first and second barrier layers have a thickness of approximately twenty-five angstroms;
the Gallium-Arsenide-Antimonide layer of the triad of layers has a thickness of approximately fifty angstroms; and
the Gallium-Arsenide-Nitride layers of the triad of layers have a thickness of approximately thirty angstroms.

19. A semiconductor laser for emitting photons at relatively long wavelengths, the semiconductor laser comprising:

a semiconductor substrate;

one or more sets of a triad of active layers over the semiconductor substrate, the one or more sets of the triad of active layers forming a W quantum well structure to provide carrier confinement for lasing, the W quantum well structure having electron wells and hole wells forming an energy band that reduces an energy gap between a conduction band and a valence band to emit photons at relatively long wavelengths, the W quantum well structure having a first barrier layer and a second barrier layer of Aluminum-Gallium-Arsenide adjacent to and sandwiching the one or more sets of the triad of active layers and the triad of active layers includes a central layer of Gallium-Arsenide-Antimonide;

an optical confinement region formed around the one or more sets of the triad of active layers, the optical confinement region to confine photons to an active region within the one or more sets of the triad of active layers; and a first contact terminal and a second contact terminal, the first contact terminal joined to a surface of the semiconductor laser to allow emission of photons therefrom, the second contact terminal joined to the semiconductor substrate.

20. The semiconductor laser of claim 19 wherein,
outer layers of the triad of active layers sandwich the central layer, and
the outer layers of the triad of active layers are a material from the set of Aluminum-Gallium-Arsenide, Indium-Gallium-Phosphide, and Indium-Gallium-Arsenide-Phosphide.

21. The semiconductor laser of claim 19 wherein,
outer layers of the triad of active layers are Aluminum-Gallium-Arsenide sandwiching the central layer of the triad of active layers.

22. The semiconductor laser of claim 19 wherein,
the outer layers of the triad of active layers are Indium-Gallium-Phosphide sandwiching the central layer of the triad of active layers.

23. The semiconductor laser of claim 19 wherein,
the outer layers of the triad of active layers are Indium-Gallium-Arsenide-Phosphide sandwiching the central layer of the triad of active layers.

24. A type II quantum well semiconductor laser for emitting photons at relatively long wavelengths, the type II quantum well semiconductor laser comprising:

a semiconductor substrate;

active layers over the semiconductor substrate, the active layers forming a type II quantum well structure to provide carrier confinement for lasing, the electron wells and hole wells of the type II quantum well structure forming an energy band that reduces an energy gap between a conduction band and a valence band to emit photons at relatively long wavelengths, the active layers including,
a first barrier layer and a second barrier layer, and
at least one triad of layers of Gallium-Arsenide-Nitride/Gallium-Arsenide-Antimonide/Gallium-Arsenide-Nitride sandwiched between the first barrier layer and the second barrier layer;

an optical confinement region formed around the active layers, the optical confinement region to confine photons to an active region within the active layers; and a first contact terminal and a second contact terminal, the first contact terminal joined to a surface of the semiconductor laser to allow emission of photons therefrom, the second contact terminal joined to the semiconductor substrate.

25. The type II quantum well semiconductor laser of claim 24, wherein the active layers further include
another triad of layers of Gallium-Arsenide-Nitride/Gallium-Arsenide-Antimonide/Gallium-Arsenide-Nitride adjacent to the at least one triad of layers of Gallium-Arsenide-Nitride/Gallium-Arsenide-Antimonide/Gallium-Arsenide-Nitride and sandwiched between the first barrier layer and the second barrier layer.

26. The type II quantum well semiconductor laser of claim 24, wherein the active layers further include a plurality of triad of layers of Gallium-Arsenide-Nitride/ Gallium-Arsenide-Antimonide/Gallium-Arsenide-Nitride adjacent to the at least one triad of layers of Gallium-Arsenide-Nitride/Gallium-Arsenide-Antimonide/Gallium-Arsenide-Nitride and sandwiched between the first barrier layer and the second barrier layer to form M hole well structures and N electron well structures.

27. The type II quantum well semiconductor laser of claim 24, wherein
the first and second barrier layers are layers of Gallium-Arsenide.

28. The type II quantum well semiconductor laser of claim 27 wherein,
the Gallium-Arsenide layers each have a thickness of approximately twenty-five angstroms,
the Gallium-Arsenide-Antimonide layer of the at least one triad of layers has a thickness of approximately fifty angstroms, and
the Gallium-Arsenide-Nitride layers of the at least one triad of layers each have a thickness of approximately thirty angstroms.

29. The type II quantum well semiconductor laser of claim 24 wherein,
the semiconductor laser is electrically pumped through the first and second contact terminals.

30. The type II quantum well semiconductor laser of claim 24 wherein,
the type II quantum well semiconductor laser to emit photons having a wavelength ranging from 1.2 microns to 1.7 microns.

31. The type II quantum well semiconductor laser of claim 24 wherein,
the type II quantum well semiconductor laser to emit photons having a wavelength of approximately 1.3 microns.

32. The type II quantum well semiconductor laser of claim 24 wherein,
the type II quantum well semiconductor laser is a vertical cavity surface emitting laser (VCSEL).

33. The type II quantum well semiconductor laser of claim 32 wherein,
the optical confinement region is formed by a first distributed Bragg reflector joined to the first barrier layer and a second distributed Bragg reflector joined to the second barrier layer.

34. A method of lasing at relatively long wavelengths in a semiconductor laser, the method comprising:
providing a semiconductor laser having a W quantum well materials system with an active region of a triad of active layers with a conduction band and a valance band forming an energy gap shaped similar to a letter W;
providing a forward bias across terminals of the semiconductor laser; and
providing a threshold current through the terminals of the semiconductor laser sufficient to inject carriers into the active region to have holes and electrons in the W quantum well materials system recombine and emit photons.

35. The method of claim 32 of lasing at relatively long wavelengths in a semiconductor laser wherein,
the semiconductor laser having the W quantum well materials system is electrically pumped by the forward bias and the threshold current.

36. The method of claim 34 of lasing at relatively long wavelengths in a semiconductor laser wherein,
the semiconductor laser to emit photons having a wavelength ranging from 1.2 microns to 1.7 microns.

37. The method of claim 34 of lasing at relatively long wavelengths in a semiconductor laser wherein,
the semiconductor laser to emit photons having a wavelength of approximately 1.3 microns.

38. The method of claim 34 of lasing at relatively long wavelengths in a semiconductor laser wherein,
the semiconductor laser is a vertical cavity surface emitting laser (VCSEL).

39. The method of claim 38 of lasing at relatively long wavelengths in a semiconductor laser wherein,
the semiconductor laser further has
an optical confinement region formed by a first distributed Bragg reflector and a second distributed Bragg reflector.

40. A method of lasing at relatively long wavelengths in a semiconductor laser the method comprising:
providing a semiconductor laser having a W quantum well materials system including
a first quantum layer, the first quantum layer having an energy band reducing an energy gap between a conduction band and a valence band to emit photons at relatively long wavelengths,
a central quantum layer connected to the first quantum layer,
an end quantum layer connected to the central quantum layer, the end quantum layer having an energy band reducing the energy gap between the conduction band and the valence band to emit photons at relatively long wavelengths, and
two outer barrier layers adjacent to the first quantum layer and the end quantum layer;
providing a forward bias across terminals of the semiconductor laser; and
providing a threshold current through the terminals of the semiconductor laser sufficient to inject carriers into the active region to have holes and electrons in the W quantum well materials system recombine and emit photons.

41. A semiconductor laser comprising:
a semiconductor substrate;
an active area over the semiconductor substrate, the active area including,
a type II quantum well materials system, the type II quantum well materials system including,
a first quantum layer,
a second quantum layer formed adjacent to the first quantum layer,
a third quantum layer formed adjacent to the second quantum layer,
the first and third quantum layers having atomic energy bands differing from the second quantum layer to form a W shaped conduction band to emit photons at relatively long wavelengths, and
a first and a second barrier layer sandwiching the quantum layers;
an optical confinement region formed around the active area to confine photons to a region of the active area; and
a first contact terminal and a second contact terminal to provide current and power, the first contact terminal joined to a surface of the semiconductor laser to allow emission of photons therefrom, the second contact terminal joined to the semiconductor substrate.

42. The semiconductor laser of claim 41 wherein, the first and second barrier layers are Aluminum-Gallium-Arsenide and the second quantum layer is Gallium-Arsenide-Antimonide.

43. The semiconductor laser of claim 41 wherein the active area further includes,
    a fourth quantum layer formed adjacent to the third quantum layer,
    a fifth quantum layer formed adjacent to the fourth quantum layer, and
    the first, third and fifth quantum layers having atomic energy bands differing from the second and fourth quantum layers to further form the W shaped conduction band to emit photons at relatively long wavelengths.

44. The semiconductor laser of claim 41 further comprising:
    a first contact terminal and a second contact terminal to provide current and power to the semiconductor laser, the first contact terminal joined to a surface of the semiconductor laser to allow emission of photons therefrom, the second contact terminal joined to the semiconductor substrate.

45. The semiconductor laser of claim 44 wherein, the semiconductor laser is electrically pumped through the first and second contact terminals.

46. The semiconductor laser of claim 41 wherein, the semiconductor laser to emit photons having a wavelength ranging from 1.2 microns to 1.7 microns.

47. The semiconductor laser of claim 41 wherein, the semiconductor laser to emit photons having a wavelength of approximately 1.3 microns.

48. The semiconductor laser of claim 41 wherein, the semiconductor laser is a vertical cavity surface emitting laser (VCSEL).

49. The semiconductor laser of claim 48 wherein, the optical confinement region formed by a first distributed Bragg reflector and a second distributed Bragg reflector, and
the active area located between the first distributed Bragg reflector and the second distributed Bragg reflector.

50. A semiconductor laser comprising:
a semiconductor substrate;
an active area over the semiconductor substrate, the active area including,
    a type II quantum well materials system, the type II quantum well materials system including,
        a first quantum layer,
        a second quantum layer formed adjacent to the first quantum layer,
        a third quantum layer formed adjacent to the second quantum layer,
        the first and third quantum layers having atomic energy bands differing from the second quantum layer to reduce an energy gap between a conduction band and a valence band to emit photons at relatively long wavelengths, and
        a first and a second barrier layer sandwiching the quantum layers;
an optical confinement region formed around the active area to confine photons to a region of the active area; and,
wherein the first and second barrier layers are Gallium-Arsenide, the first and third quantum layers are Gallium-Arsenide-Nitride and the second quantum layer is Gallium-Arsenide-Antimonide.

51. The semiconductor laser of claim 50 wherein,
the Gallium-Arsenide layers each have a thickness of approximately twenty-five angstroms,
the Gallium-Arsenide-Antimonide layer has a thickness of approximately fifty angstroms, and
the Gallium-Arsenide-Nitride layers each have a thickness of approximately thirty angstroms.

52. A semiconductor laser comprising:
a semiconductor substrate;
an active area over the semiconductor substrate, the active area including,
    a type II quantum well materials system, the type II quantum well materials system including,
        a first quantum layer,
        a second quantum layer formed adjacent to the first quantum layer,
        a third quantum layer formed adjacent to the second quantum layer,
        the first and third quantum layers having atomic energy bands differing from the second quantum layer to reduce an energy gap between a conduction band and a valence band to emit photons at relatively long wavelengths, and
        a first and a second barrier layer sandwiching the quantum layers;
an optical confinement region formed around the active area to confine photons to a region of the active area; and,
wherein the first and second barrier layers are Aluminum-Gallium-Arsenide and the second quantum layer is Gallium-Arsenide-Antimonide, and
the first and third quantum layers sandwiching the second quantum layer are Indium-Gallium-Arsenide-Phosphide.

53. A semiconductor laser comprising:
a semiconductor substrate;
an active area over the semiconductor substrate, the active area including,
    a type II quantum well materials system, the type II quantum well materials system including,
        a first quantum layer,
        a second quantum layer adjacent the first quantum layer,
        a third quantum layer adjacent the second quantum layer,
        a fourth quantum layer adjacent the third quantum layer,
        a fifth quantum layer adjacent the fourth quantum layer,
        a first barrier layer and a second barrier layer sandwiching the quantum layers,
        the first, third and fifth quantum layers having atomic energy bands differing from the second and fourth quantum layers to reduce an energy gap between a conduction band and a valence band to emit photons at relatively long wavelengths, and
        wherein the first and second barrier layers are Gallium-Arsenide, the first, third, and fifth quantum layers are Gallium-Arsenide-Nitride and the second and fourth quantum layers are Gallium-Arsenide-Antimonide; and,
an optical confinement region formed around the active area to confine photons to a region of the active area.

54. A method of forming a type II quantum well semiconductor laser comprising:

providing a semiconductor substrate;

providing at least three active layers over the semiconductor substrate, the at least three active layers forming a W quantum well structure to provide carrier confinement for lasing, the W quantum well structure having a conduction band shaped similar to a letter W near a light emitting region to emit photons at relatively long wavelengths;

providing an optical confinement region around the at least three active layers, the optical confinement region to confine photons to an active region within the at least three active layers; and providing a first contact terminal and a second contact terminal, the first contact terminal joined to a surface of the semiconductor laser to allow emission of photons therefrom, the second contact terminal joined to the semiconductor substrate.

55. The method of claim 54 wherein, the type II quantum well semiconductor laser to emit photons having a wavelength ranging from 1.2 microns to 1.7 microns.

56. The method of claim 54 wherein, the type II quantum well semiconductor laser to emit photons having a wavelength of approximately 1.3 microns.

57. The method of claim 54 wherein, the type II quantum well semiconductor laser is a vertical cavity surface emitting laser (VCSEL).

58. The method of claim 57 wherein, the optical confinement region formed by a first distributed Bragg reflector and a second distributed Bragg reflector, the active layers located between the first distributed Bragg reflector and the second distributed Bragg reflector.

59. A method of forming a type II quantum well semiconductor laser comprising:

providing a semiconductor substrate;

providing active layers over the semiconductor substrate, the active layers forming a W quantum well structure to provide carrier confinement for lasing, the W quantum well structure having electron wells and hole wells forming an energy band that reduces an energy gap between a conduction band and a valence band to emit photons at relatively long wavelengths, the W quantum well structure comprises a first barrier layer and a triad of layers of Gallium-Arsenide-Nitride/Gallium-Arsenide-Antimonide/Gallium-Arsenide-Nitride and a second barrier layer, the first and second barrier layers each adjacent to one of the Gallium-Arsenide-Nitride layers;

providing an optical confinement region around the active layers, the optical confinement region to confine photons to an active region within the active layers; and providing a first contact terminal and a second contact terminal, the first contact terminal joined to a surface of the semiconductor laser to allow emission of photons therefrom, the second contact terminal joined to the semiconductor substrate.

60. The method of claim 59 wherein, the first barrier layer and the second barrier layer are Gallium-Arsenide.

61. The method of claim 59 wherein, the Arsenide concentration varies as a percentage of (1−X) and the Nitride concentration varies as a percentage of X in each of Gallium-Arsenide-Nitride layers and the Arsenide concentration varies as a percentage of (1−Y) and the Antimony concentration varies as a percentage of Y in the Gallium-Arsenide-Antimonide layer.

62. The method of claim 60 wherein, the Gallium-Arsenide of the first and second barrier layers can range between ten and one hundred angstroms in thickness and the Gallium-Arsenide-Antimonide layer can range between ten and one hundred angstroms in thickness.

63. A method of forming a type II quantum well semiconductor laser comprising:

providing a semiconductor substrate;

providing active layers over the semiconductor substrate, the active layers forming a W quantum well structure to provide carrier confinement for lasing, the W quantum well structure having electron wells and hole wells forming an energy band that reduces an energy gap between a conduction band and a valence band to emit photons at relatively long wavelengths, the W quantum well structure including a first Gallium-Arsenide layer, a triad of layers of Gallium-Arsenide-Nitride/Gallium-Arsenide-Antimonide/Gallium-Arsenide-Nitride, a second Gallium-Arsenide layer, the first Gallium-Arsenide layer joined to one of the Gallium-Arsenide-Nitride layers and the second Gallium-Arsenide layer joined to another one of the Gallium-Arsenide-Nitride layers;

providing an optical confinement region formed around the active layers, the optical confinement region to confine photons to an active region within the active layers; and providing a first contact terminal and a second contact terminal, the first contact terminal joined to a surface of the semiconductor laser to allow emission of photons therefrom, the second contact terminal joined to the semiconductor substrate.

64. The method of claim 63 wherein, the first Gallium-Arsenide layer and the second Gallium-Arsenide layer each have a thickness of approximately twenty-five angstroms, the Gallium-Arsenide-Antimonide layer of the plurality of the triad of layers has a thickness of approximately fifty angstroms, and the Gallium-Arsenide-Nitride layers of the plurality of the triad of layers have a thickness of approximately thirty angstroms.

65. A long-wavelength semiconductor laser comprising:

a plurality of a triad of layers of Gallium-Arsenide-Nitride/Gallium-Arsenide-Antimonide/Gallium-Arsenide-Nitride to form a plurality of W quantum wells;

a first Gallium-Arsenide layer adjacent to one of the plurality of the triad of layers of Gallium-Arsenide-Nitride/Gallium-Arsenide-Antimonide/Gallium-Arsenide-Nitride;

a second Gallium-Arsenide layer adjacent to another one of the plurality of the triad of layers of Gallium-Arsenide-Nitride/Gallium-Arsenide-Antimonide/Gallium-Arsenide-Nitride; and the plurality of the triad of layers of Gallium-Arsenide-Nitride/Gallium-Arsenide-Antimonide/Gallium-Arsenide-Nitride sandwiched between the first Gallium-Arsenide layer and the second Gallium-Arsenide layer.

66. The long-wavelength semiconductor laser of claim 65 wherein,
the long-wavelength semiconductor laser to emit photons having a wavelength ranging from 1.2 microns to 1.7 microns.

67. The long-wavelength semiconductor laser of claim 65 wherein,
the first Gallium-Arsenide layer and the second Gallium-Arsenide layer each have a thickness of approximately twenty-five angstroms;
the Gallium-Arsenide-Antimonide layer of the plurality of the triad of layers has a thickness of approximately fifty angstroms; and
the Gallium-Arsenide-Nitride layers of the plurality of the triad of layers have a thickness of approximately thirty angstroms.

68. The long-wavelength semiconductor laser of claim 67 wherein,
the long-wavelength semiconductor laser to emit photons having a wavelength of approximately 1.3 microns.

69. The long-wavelength semiconductor laser of claim 65 further comprising:
a first distributed Bragg reflector adjacent to the first Gallium-Arsenide layer; and
a second distributed Bragg reflector adjacent to the second Gallium-Arsenide layer.

70. A semiconductor laser for emitting photons at relatively long wavelengths, the semiconductor laser comprising:
a semiconductor substrate;
one or more sets of three active layers over the semiconductor substrate, the one or more sets of the three active layers forming a W quantum well structure to provide carrier confinement for lasing, the W quantum well structure having an energy gap between a conduction band and a valance band shaped similar to a letter W near a light emitting region;
an optical confinement region formed around the one or more sets of the three active layers, the optical confinement region to confine photons to an active region within the one or more sets of the three active layers; and
a first contact terminal and a second contact terminal, the first contact terminal joined to a surface of the semiconductor laser to allow emission of photons therefrom, the second contact terminal joined to the semiconductor substrate.

71. The semiconductor laser of claim 70 wherein,
the W quantum well structure has an energy band including a conduction band and a valence band forming an energy gap shaped similar to a letter W.

72. A method of lasing at relatively long wavelengths in a semiconductor laser, the method comprising:
providing a semiconductor laser having a Type II quantum well materials system with an active region having at least three layers to form a conduction band shaped similar to a letter W;
providing a forward bias across terminals of the semiconductor laser; and
providing a threshold current through the terminals of the semiconductor laser sufficient to inject carriers into the active region to have holes and electrons in the Type II quantum well materials system recombine and emit photons.

73. A method of lasing at relatively long wavelengths in a semiconductor laser, the method comprising:
providing a semiconductor laser having a Type II quantum well materials system with an active region having at least three layers with a conduction band and a valance band forming an energy gap shaped similar to a letter W;
providing a forward bias across terminals of the semiconductor laser; and
providing a threshold current through the terminals of the semiconductor laser sufficient to inject carriers into the active region to have holes and electrons in the Type II quantum well materials system recombine and emit photons.

74. A semiconductor laser comprising:
a semiconductor substrate;
an active area over the semiconductor substrate, the active area including,
a type II quantum well materials system, the type II quantum well materials system including,
a first quantum layer,
a second quantum layer formed adjacent to the first quantum layer,
a third quantum layer formed adjacent to the second quantum layer,
the first and third quantum layers having atomic energy bands differing from the second quantum layer to reduce an energy gap between a conduction band and a valence band to emit photons at relatively long wavelengths, and
a first and a second barrier layer sandwiching the quantum layers;
an optical confinement region formed around the active area to confine photons to a region of the active area; and,
wherein the first and second barrier layers are Aluminum-Gallium-Arsenide and the second quantum layer is Gallium-Arsenide-Antimonide, and
the first and third quantum layers sandwiching the second quantum layer are Indium-Gallium-Phosphide.

75. A surface emitting semiconductor laser for emitting photons at relatively long wavelengths, the surface emitting semiconductor laser comprising:
at least three active layers joined in parallel together to form a W quantum well structure having a conduction band shaped similar to a letter W near a light emitting region;
a first distributed Bragg reflector formed over a first outer layer of the at least three active layers;
a second distributed Bragg reflector formed under a second outer layer of the at least three active layers;
a first contact terminal formed over the first distributed Bragg reflector to allow emission of photons from the surface emitting semiconductor laser; and
a second contact terminal formed under the second distributed Bragg reflector.

76. A surface emitting semiconductor laser for emitting photons at relatively long wavelengths, the surface emitting semiconductor laser comprising:
at least three active layers joined in parallel together to form a Type II quantum well materials structure, energy bands of each of the at least three active layers to provide a staggered band alignment to confine electrons and holes in adjacent layers to form a conduction band and a valence band with an energy gap shaped similar to a letter W;

a first distributed Bragg reflector formed over a first outer layer of the at least three active layers;

a second distributed Bragg reflector formed under a second outer layer of the at least three active layers;

a first contact terminal formed over the first distributed Bragg reflector to allow emission of photons from the surface emitting semiconductor laser; and a second contact terminal formed under the second distributed Bragg reflector.

77. A surface emitting semiconductor laser for emitting photons at relatively long wavelengths, the surface emitting semiconductor laser comprising:

at least three active layers joined in parallel together to form a Type II quantum well materials structure, energy bands of each of the at least three active layers to provide a staggered band alignment to confine electrons and holes in adjacent layers to form a conduction band shaped similar to a letter W;

a first distributed Bragg reflector formed over a first outer layer of the at least three active layers;

a second distributed Bragg reflector formed under a second outer layer of the at least three active layers;

a first contact terminal formed over the first distributed Bragg reflector to allow emissions of photons from the surface emitting semiconductor laser; and a second contact terminal formed under the second distributed Bragg reflector.

78. A surface emitting semiconductor laser for emitting photons at relatively long wavelengths, the surface emitting semiconductor laser comprising:

at least three active layers joined in parallel together to form a Type II quantum well materials structure, energy bands of each of the at least three active layers to provide a staggered band alignment to confine electrons and holes in adjacent layers to form a conduction band and a valence band with an energy gap shaped similar to a letter W and overlapping hole and electron wavefunctions to achieve photon emissions at wavelengths over the range of 1.2 microns to 1.7 microns;

a first distributed Bragg reflector formed over a first outer layer of the at least three active layers;

a second distributed Bragg reflector formed under a second outer layer of the at least three active layers;

a first contact terminal formed over the first distributed Bragg reflector to allow emission of photons from the surface emitting semiconductor laser; and a second contact terminal formed under the second distributed Bragg reflector.

79. A semiconductor laser for emitting photons at relatively long wavelengths, the semiconductor laser comprising:

a first distributed Bragg reflector;

a W quantum well materials system over the first distributed Bragg reflector first barrier layer, the W quantum well materials system including a first outer barrier layer, a first quantum layer adjacent the first barrier layer, the first quantum layer having an energy band reducing an energy gap between a conduction band and a valence band to emit photons at relatively long wavelengths, a central quantum layer connected to the first quantum layer, an end quantum layer connected to the central quantum layer, the end quantum layer having an energy band reducing the energy gap between the conduction band and the valence band to emit photons at relatively long wavelengths, and a second outer barrier layer adjacent the end quantum layer;

a first contact terminal formed under the first distributed Bragg reflector; and a second contact terminal formed over the second distributed Bragg reflector.

* * * * *